(12) United States Patent
Jain

(10) Patent No.: US 6,469,925 B1
(45) Date of Patent: Oct. 22, 2002

(54) MEMORY CELL WITH IMPROVED RETENTION TIME

(76) Inventor: Raj Kumar Jain, 66 Bayshore Road, Unit 06-06, Diamond Tower (SG), 469985

( * ) Notice: Subject to any disclaimer, the term of this patent is extended or adjusted under 35 U.S.C. 154(b) by 0 days.

(21) Appl. No.: 09/855,167

(22) Filed: May 14, 2001

Related U.S. Application Data

(63) Continuation-in-part of application No. 09/806,299, filed on Oct. 3, 2001, and a continuation-in-part of application No. 09/806,395, filed on Dec. 6, 2001, and a continuation-in-part of application No. 09/615,987, filed on Jul. 14, 2000, now Pat. No. 6,304,478.

(51) Int. Cl.$^7$ ............................................... G11C 11/40
(52) U.S. Cl. .................... 365/154; 365/189.11
(58) Field of Search .................. 365/154, 155, 365/156, 189.11, 226

(56) References Cited

U.S. PATENT DOCUMENTS

| 4,571,703 | A | * | 2/1986 | Noda | 365/154 |
| 5,946,261 | A | * | 8/1999 | Artieri | 365/230.05 |
| 5,959,931 | A | * | 9/1999 | Ueda | 365/230.05 |
| 6,026,012 | A | * | 2/2000 | Hsu | 365/230.05 |

* cited by examiner

*Primary Examiner*—Tan T. Nguyen
(74) *Attorney, Agent, or Firm*—Dexter Chin

(57) ABSTRACT

A memory cell having first and second access transistors coupled to a storage transistor is disclosed. A boosted voltage is coupled to the gate of the storage transistor to increase the charge stored in the memory cell, thereby improving retention time.

20 Claims, 3 Drawing Sheets

US 6,469,925 B1

MEMORY CELL WITH IMPROVED RETENTION TIME

This is a continuation-in-part of patent applications, titled: "Dual-Port Memory Cell", U.S. Ser. No. 09/806,299 filed on Oct. 3, 2001 (attorney docket number: 98P02816US); "Single-Port Memory Cell", U.S. Ser. No. 09/806,395 titled on Dec. 6, 2001 (attorney docket number 98P 02842US) and "Layout for a SemiConductor Memory", U.S. Ser. No. 09/615,987 filed on Jul. 14, 2000 (attorney docket number: 98P 2864US), now U.S. Pat. No. 6,304,478.

FIELD OF INVENTION

The present invention relates generally to memory cells. More particularly, the invention relates to memory cells having improved retention time.

BACKGROUND OF INVENTION

Integrated circuits (ICs) such as digital signal processors (DSPs) include on-chip memory to store information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime. In order to restore the information stored in the cell, a refresh operation is required. Typically, refreshing of memory cells interrupts the normal operation, adversely impacting performance.

As evidenced from the above discussion, it is desirable to provide a memory cell with improved retention time.

SUMMARY OF THE INVENTION

The present invention relates to improving retention time in memory cells. In one embodiment, the memory cell comprises first and second access transistors coupled to respective first and second terminals of a storage transistor. The gate of the storage transistor is coupled to a boosted voltage to increase the charge stored therein. In one embodiment, the boosted voltage is greater than VDD.

PREFERRED EMBODIMENTS OF THE INVENTION

Figure 1:
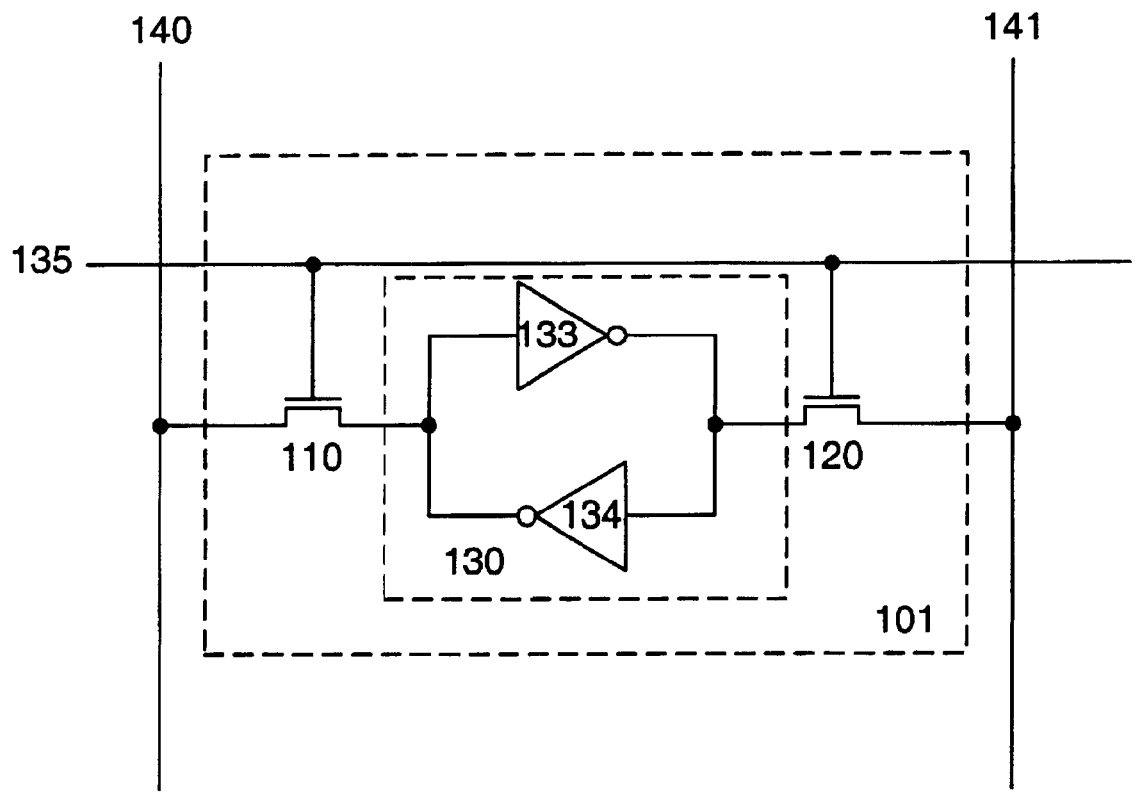
FIG. 1 shows a conventional SRAM cell.
Figure 2:
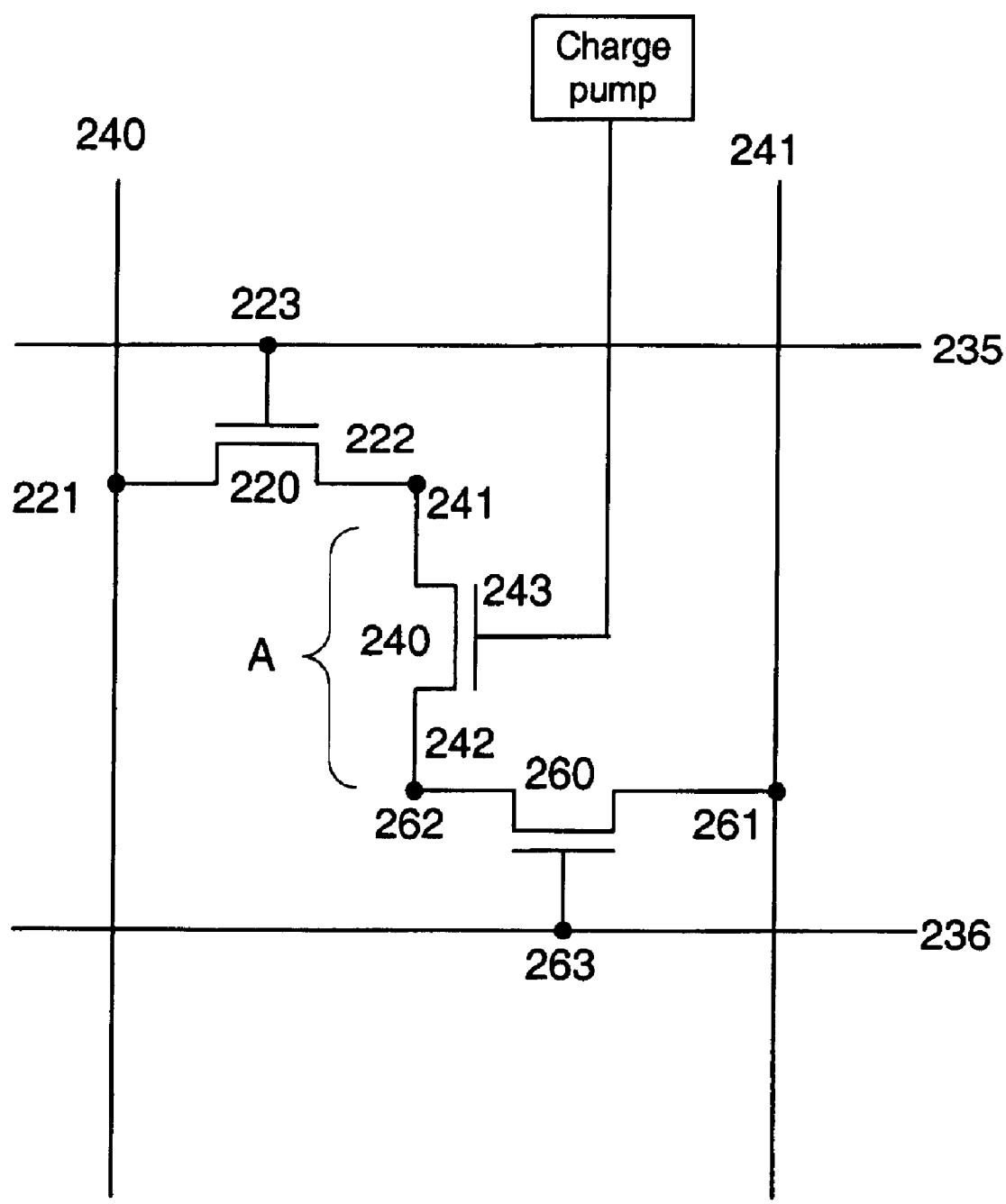
FIG. 2 shows a memory cell in accordance with one embodiment of the invention.

FIG. 2 shows a memory cell 201 in accordance with one embodiment of the invention. Such memory cell, for example, is described in parent patent applications titled: "Dual-Port Memory Cell", U.S. Ser. No. 09/806,299 (attorney docket number: 98P02816US); "Single-Port Memory Cell", U.S. Ser. No. 09/806,395 (attorney docket number: 98P 02842US) and "Layout for a SemiConductor Memory", U.S. Ser. No. 09/615,987 (attorney docket number: 98P 2864 US) which are herein incorporated by reference for all purposes. The memory cell comprises first and second access transistors 220 and 260 coupled in series to a storage transistor 240. The transistors, in one embodiment, comprise n-FETs. The use of p-FETs or a combination of n and pFETs is also useful.

The access transistors serve as memory access ports, each coupled to a bit line (240 or 241) and a word line (235 or 236). In one embodiment, the first access transistor's first terminal 221 is coupled to the bit line 240 and its gate is coupled to the word line 235. Similarly, the second access transistor's first terminal 261 is coupled to bit line 241 and its gate is coupled to word line 236. The memory cell can be accessed either through the first or second port. Refreshing of the memory cell can also be performed through the access ports.

Second terminals 222 and 262 of the access transistors are coupled to respective first and second terminals 241 and 242 of the storage transistor. A gate 243 of the storage transistor is coupled to an active signal to render the transistor conductive. In one embodiment, the storage transistor comprises an n-FET with its gate coupled to, for example, $V_{DD}$. As such, when power is applied to the IC, the storage transistor is rendered conductive, coupling the first and second terminals together, forming node A. When power is removed from the IC, the first and second terminals are isolated from each other.

A memory access from the first port is performed by activating the word line 235 (e.g., logic 1) to render the first access transistor conductive. As a result, node A is coupled to the bit line via the first access transistor's first terminal 221. The charge stored at node A is transferred to the bit line for a read access or the charge on the bit line is transferred to node A for a write access by write circuitry (not shown). Accessing the second port of the memory cell is achieved by selecting the word line 236 to couple node A to the bit line 141. A refresh can be performed in the first or second port by activating the first or second word line.

In another embodiment, the first port of the memory cell serves as an access port and the second port of the memory cell serves as a dedicated refresh port from which refreshes are performed. The first port is coupled to a bit line and a word line while the refresh port is coupled to a refresh bit line and a refresh word line. The operation of such a memory cell is described in concurrently filed patent application titled: "Memory Architecture with Refresh and Sense Amplifiers", U.S. Ser. No. 09/855,147 (attorney docket number: 00E 16984SG), which is herein incorporated by reference for all purposes.

In accordance with one embodiment of the invention, a boosted voltage is applied to the gate of the storage transistor during the operation of the IC. The boosted voltage is generated by, for example, a charge pump. For an n-FET storage transistor, the boosted voltage is greater than $V_{DD}$ for an n-FET storage transistor, where $V_{DD}$ is the operating voltage for most of the logic in the IC. The boosted voltage advantageously compensates for the voltage drop across the storage transistor, thereby increasing the logic 1 voltage stored in node A. In one embodiment, the boosted voltage is equal to or greater than $V_{DD}+V_{Ts}$, where $V_{Ts}$ is the gate threshold voltage of the storage transistor. Preferably, the boosted voltage is equal to about $V_{DD}+V_{Ts}+\Delta V$, where $\Delta V$ is, for example, about 0.1 to 0.3V. $\Delta V$ serves to compensate for the body effect of the transistor and voltage variations, thus ensuring that the logic 1 voltage stored in node A is equal to about $V_{DD}$. By increasing the charge stored in node A to $V_{DD}$ instead of $V_{DD}-V_T$ (as in the case where a boosted voltage is not used), cell retention time is improved. Increasing the charge stored in node A also improves the performance of the sense amplifier (e.g., better noise rejection due to improved noise margin). Alternatively, for a p-FET storage transistor, the boosted voltage is less than ground or 0V, preferably, less than $0-V_{Ts}$, and more preferably about $0-V_{Ts}-\Delta V$.

In another embodiment of the invention, the access transistor of the memory cell is activated or rendered conductive using a boosted voltage to increase the charge stored in node A. For n-FET type access transistors, the boosted voltage is greater than $V_{DD}$. In one embodiment, the boosted voltage equal to or greater than $V_{DD}+V_{Ta}$, where $V_{Ta}$ is the gate threshold voltage of the access transistor. Preferably, the boosted voltage is equal to about $V_{DD}+V_{Ta}+\Delta V$.

Figure 3:
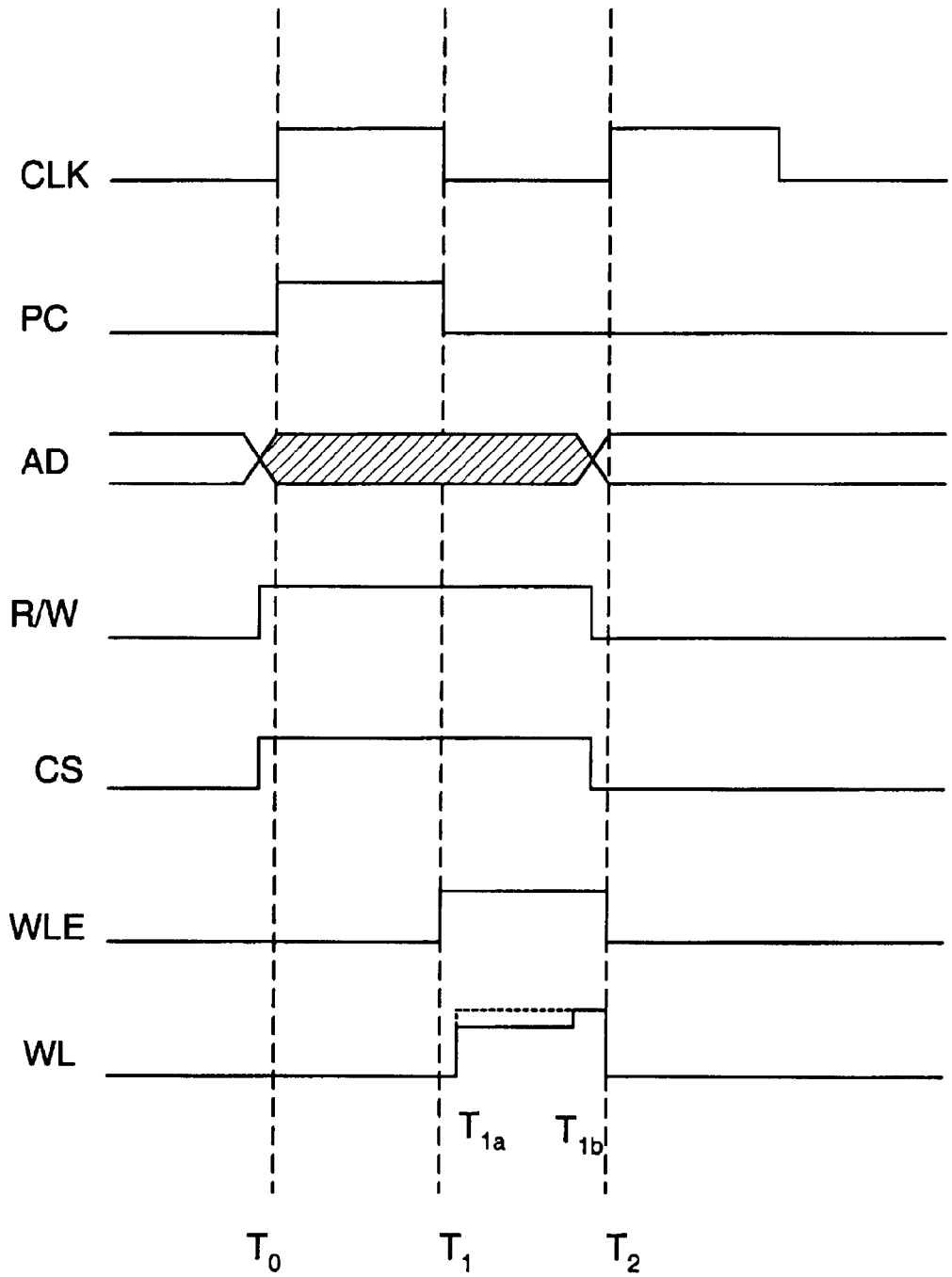
FIG. 3 shows a timing and diagram of the operation of the memory cell in accordance with one embodiment of the invention.

FIG. 3 shows a waveform of the signal used to activate an access transistor in accordance with one embodiment of the invention. The waveform WL represents the activated or selected word line coupled to the access transistor. Typically, an active SEL signal is provided to the memory array to initiate a memory access slightly before the rising edge of the clock (CLK) at $T_0$. The R/W signal indicates the type of access (e.g., read or write). At the falling edge of the CLK at $T_1$, the word line enable (WLE) signal goes high to activate the word line driver corresponding to the address (AD). This causes the word line (WL) to be driven to a first voltage level (logic 1 or $V_{DD}$) at $T_{1a}$. At $T_{1b}$, the word line voltage is increased to the boosted voltage level until $T_2$, the end of the memory access. Boosting the WL voltage from $T_{1b}$ to the end of the memory access cycle increases the logic 1 charge stored in node A. Such a waveform can be generated using, for example, clocking circuitry to control the word line driver. In an alternative embodiment, the word line can be driven to the boosted level from $T_{1a}$ to $T_2$.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising: first and second access transistors, each with a gate and first and second terminals first and second bit lines, the first bit line coupled to the first terminal of the first access transistor and the second bit line coupled to the first terminal of the second transistor;

first and second word lines, the first word line coupled to the first access transistor and the second word line coupled to the second access transistor;

a storage transistor having a gate and first and second terminals, the first and second terminals respectively coupled to the second terminals of the first and second access transistors; and a charge pump coupled to the gate of the storage transistor, the charge pump providing a first boosted voltage source which is greater than $V_{DD}$.

2. The memory cell of claim 1 wherein the first access transistor serves as an access port.

3. The memory cell of claim 2 wherein the second access transistor serves as a refresh port.

4. The memory cell of claim 3 wherein the refresh port is coupled to a refresh bit line and a refresh word line.

5. The memory cell of claim 3 wherein the first boosted voltage source is greater or equal to $V_{DD}+V_{Ts}$.

6. The memory cell of claim 5 wherein the first boosted voltage source is equal to about $V_{DD}+V_{Ts}+\Delta V$.

7. The memory cell of claim 1 wherein the first boosted voltage source is greater or equal to $V_{DD}+V_{Ts}$.

8. The memory cell of claim 7 wherein the first boosted voltage source is equal to about $V_{DD}+V_{Ts}+\Delta V$.

9. The memory cell of claim 7 wherein the access transistors are activated by a second boosted voltage source.

10. The memory cell of claim 9 wherein the second boosted voltage source is greater than $V_{DD}$.

11. The memory cell of claim 10 wherein the second boosted voltage source is greater or equal to $V_{DD}+V_{Ta}$.

12. The memory cell of claim 11 wherein the second boosted voltage source is equal to about $V_{DD}-V_{Ta}+\Delta V$.

13. The memory cell of claim 1 wherein the access transistors are activated by a second boosted voltage source.

14. The memory cell of claim 13 wherein the second boosted voltage source is greater than $V_{DD}$.

15. The memory cell of claim 14 wherein the second boosted voltage source is greater or equal to $V_{DD}+V_{Ta}$.

16. The memory cell of claim 15 wherein the second boosted voltage source is equal to about $V_{DD}+V_{Ta}+\Delta V$.

17. The memory cell of claim 14 wherein the first access transistor serves as an access port.

18. The memory cell of claim 17 wherein the second access transistor serves as a refresh port.

19. The memory cell of claim 18 wherein the refresh port is coupled to a refresh bit line and a refresh word line.

20. The memory cell of claim 14 wherein the second access transistor serves as a refresh port.

* * * * *